United States Patent [19]
Sato et al.

[11] Patent Number: 5,764,565
[45] Date of Patent: Jun. 9, 1998

[54] STATIC TYPE SEMICONDUCTOR MEMORY DEVICE WITH TWO WORD LINES FOR ONE ROW

[75] Inventors: Hirotoshi Sato; Motomu Ukita; Yutaka Arita, all of Hyogo, Japan

[73] Assignee: Mitsubishi Denki Kabushiki Kaisha, Tokyo, Japan

[21] Appl. No.: 874,636

[22] Filed: Jun. 13, 1997

[30] Foreign Application Priority Data

Nov. 22, 1996 [JP] Japan ................................. 8-312270

[51] Int. Cl.$^6$ .............................................. G11C 11/00
[52] U.S. Cl. .......................... 365/154; 365/156; 365/190
[58] Field of Search ................................. 365/154, 156, 365/190

[56] References Cited

U.S. PATENT DOCUMENTS

| 4,868,628 | 9/1989 | Simmons | 257/370 |
| 5,483,483 | 1/1996 | Choi et al. | 365/177 |
| 5,570,312 | 10/1996 | Fu | 365/154 |
| 5,673,230 | 9/1997 | Kuriyama | 365/203 |

FOREIGN PATENT DOCUMENTS

| 4-127470 | 4/1992 | Japan . |
| 7-161188 | 6/1995 | Japan . |

*Primary Examiner*—David C. Nelms
*Assistant Examiner*—Hoai V. Ho
*Attorney, Agent, or Firm*—McDermott, Will & Emery

[57] ABSTRACT

A memory cell includes two bipolar transistors. An upper side word line is connected to the gates of one access transistor and one depletion type transistor in the memory cell. A lower side word line is connected to the gates of the other access transistor and the other depletion type transistor in the memory cell. In data write operation, the potential on the upper side word line is set to "H" level for a prescribed period and the potential on the lower side word line is thereafter set to "H" level for a prescribed period, regardless of the type of data. As a result, a circuit related to row decoding can be simplified since a circuit for determining the type of data is not necessary in the circuit related to row decoding.

11 Claims, 15 Drawing Sheets

STATIC TYPE SEMICONDUCTOR MEMORY DEVICE WITH TWO WORD LINES FOR ONE ROW

BACKGROUND OF THE INVENTION

1. Field of the Invention

The present invention relates to a static type semiconductor memory device, and more particularly relates to a static type semiconductor memory device having a memory cell constituted by two access transistors, two driver transistors, two load elements, two bipolar transistors, and two depletion type transistors.

2. Description of the Background Art

A static random access memory (hereinafter referred to as "SRAM") as a conventional static type semiconductor memory device is disclosed, for example, in Katsuro Sasaki et al., "A 16-Mb CMOS SRAM with a 2.3-$\mu m^2$ Single-Bit-Line Memory Cell", IEEE JOURNAL OF SOLID-STATE CIRCUITS, VOL.28, NO.11, NOVEMBER 1993. The SRAM disclosed in this document employs single bit line structure. The description of the SRAM will be given with reference to the drawings.

FIG. 18 is a schematic block diagram showing an entire structure of a conventional SRAM. Referring to FIG. 18, the SRAM includes: a word decoder 95; a write/read control circuit 97; an inverter 117; a transfer gate 111; a PMOS transistor 129; a column decoder 99; a sense amplifier 101; a plurality of word line drivers 103; a plurality of word line drivers 105; a plurality of memory cells MC; a plurality of transfer gates 107; a plurality of dummy cells DC; two transfer gates 113; common data lines CD1, CD2; a plurality of word lines WU1, . . . ; a plurality of word lines WL1, . . . ; a plurality of bit lines BL1, BL2, . . . ; and dummy bit lines DB1, DB2. Each of memory cells MC is a CMOS type memory cell. Specifically, each memory cell MC has load elements L1, L2, access transistors QA1, QA2, and driver transistors QD1, QD2. Load elements L1, L2 are PMOS transistors.

Memory cell MC connected to bit line BL1 and word lines WU1, WL1 is now considered. Access transistor QA1 is placed between bit line BL1 and a storage node SN1, and has its gate connected to word line WU1. Access transistor QA2 is placed between bit line BL1 and a storage node SN2 and has its gate connected to word line WL1. Bit line BL1 is connected to common data line CD1 via transfer gate 107. Bit line BL1 and adjacent bit line BL2 constitute a pair and are switched by least significant column select signals Y0, Y0B. Bit line BL2 is connected to common data line CD2 via transfer gate 107. In data write operation, data is transferred to common data lines CD1 and CD2 via transfer gate 111 by controlling the potential on a node A.

Word lines WU1 and WL1 are respectively driven by word line drivers 103 and 105. Word line drivers 103 and 105 are controlled by word decoder 95 and upper/lower select signals U/L1, U/L2 from write/read control circuit 97. Write/read control circuit 97 receives data Din, a write signal WE and an ATD signal, and generates upper/lower select signals U/L1, U/L2, and a write data signal WD.

In addition to the regular memory cells MC, a plurality of dummy cells DC are provided and connected to corresponding dummy bit lines DB1, DB2. Dummy bit line DB1 and adjacent dummy bit line DB2 constitute a pair and are switched by least significant column select signal Y0, Y0B. In this case, the selection is opposite to the one carried out for the regular memory cells. Dummy bit lines DB1 and DB2 are respectively connected to common data lines CD1 and CD2.

The write operation is now described. FIG. 19 is a timing chart in relation to the write operation ("0" write) of the conventional SRAM. The description is given with reference to FIGS. 18 and 19. It is assumed that data "0" is to be written into memory cell MC connected to bit line BL1 and word lines WU1, WL1, that is, the potentials on the storage nodes SN1 and SN2 are respectively set to "L" level and "H" level.

The potential on one word line WU1 controlling access transistor QA1 connected to storage node SN1 which should be set to the potential of "L" level, is set to "H" level. At this time, the potential on storage node SN1 is set to "L" level by setting the potential on bit line BL1 to "L" level. Then, the potential on the other word line WL1 is set to "H" level. At this time, the potential on bit line BL1 is set to "H" level, and the potential on storage node SN2 is set to "H" level. The write operation of the conventional SRAM is thus divided into two phases.

FIG. 20 is a timing chart in relation to the write operation ("1" write) of the conventional SRAM. When data "1" is to be written, that is, the potentials on storage nodes SN1 and SN2 are respectively set to "H" and "L" levels, the potential on word line WL1 is first set to "H" level, the potential on storage node SN2 is to "L" level, and then the potential on word line WU1 is set to "H" level. The potential on storage node SN1 is thus set to "H" level.

Next the read operation is described. Assume that data is to be read out of memory cell MC connected to bit line BL1 and word lines WU1, WL1. In the read operation, the potential on the upper side word line WU1 is set to "H" level. A signal of "H" level or "L" level is thus output to bit line BL1 from memory cell according to stored data. On the other hand, a signal of a level intermediate between "H" and "L" levels is output to dummy bit line DB2 from dummy cell DC. Accordingly, potential difference is generated between bit line BL1 and dummy bit line DB2, and also between common data line CD1 and common data line CD2. Sense amplifier 101 amplifies the potential difference. At this time, column select signal Y0 is at "H" level and column select signal Y0B is at "L" level.

The CMOS type memory cell of the conventional SRAM requires following design in order to increase static noise margin and ensure data retention. Suppose that driver transistors QD1 and QD2 have channel width of Wd and channel length of Ld, and access transistors QA1 and QA2 have channel width of Wa and channel length of La. In this case, generally (Wd/Ld) should be more than three times larger than (Wa/La) in order to increase static noise margin. The area occupied by driver transistors QD1 and QD2 is thus increased, so that reduction of the area of the memory cell is prevented. Further, if the CMOS type memory cell shown in FIG. 18 is employed in SRAM which uses low supply potential, the static noise margin is decreased, resulting in difficulty in retaining data.

SUMMARY OF THE INVENTION

One object of the invention is to provide a static type semiconductor memory device in which sufficient static noise margin can be ensured without increase of the area, and sufficient static noise margin can also be ensured if the memory device is used with low supply potential.

A further object of the invention is to provide a static type semiconductor memory device in which peripheral circuitry of a memory cell array can be simplified.

The static type semiconductor memory device according to the present invention includes: a plurality of memory cells; a plurality of first word lines; a plurality of second word lines; a plurality of bit line pairs; a plurality of first word line drive circuits; a plurality of second word line drive circuits; and control means. The plurality of memory cells are arranged in a matrix of rows and columns. The first word lines are placed corresponding to respective rows. Each of the first word lines is connected to memory cells in the corresponding row. The second word lines are arranged corresponding to respective rows. Each of the second word lines is connected to the memory cells in the corresponding row. The bit line pairs are placed corresponding to respective columns. Each bit line pair is connected to the memory cells in the corresponding column. The first word line drive circuits are placed corresponding to respective first word lines. Each of the first word line drive circuits activates corresponding first word line. The second word line drive circuits are placed corresponding to respective second word lines. Each of the second word line drive circuits activates corresponding second word line. The control circuit, in data write operation, controls the first and second word line drive circuits corresponding to selected rows such that the first word line corresponding to the selected row is activated for a first prescribed period, and then the second word line corresponding to the selected row is activated for a second prescribed period.

Each of the memory cells includes: a first load element; a second load element; a first access transistor; a second access transistor; a first driver transistor; a second driver transistor; a first bipolar transistor; a second bipolar transistor; a first depletion type transistor; and a second depletion type transistor. The first load element is provided between a first supply node and a first storage node. The second load element is placed between the first supply node and a second storage node. The first access transistor is provided between the base of the first bipolar transistor and the first storage node. The second access transistor is provided between the base of the second bipolar transistor and the second storage node. The first bipolar transistor is arranged between one bit line constituting corresponding bit line pair and a second supply node.

The second bipolar transistor is placed between the other bit line constituting corresponding bit line pair and the second supply node. The first driver transistor is arranged between the first storage node and the first depletion type transistor, and has its control electrode connected to the second storage node. The second driver transistor is provided between the second storage node and the second depletion type transistor and has its control electrode connected to the first storage node. The first depletion type transistor is provided between the first driver transistor and the second supply node. The second depletion type transistor is provided between the second driver transistor and the second supply node. The first access transistor and the second depletion type transistor have their control electrodes connected to corresponding first word line. The second access transistor and the first depletion type transistor have their control electrodes connected to corresponding second word line.

In the static type semiconductor memory device according to the present invention, in the data write operation, the first word line corresponding to the selected row is activated for the first prescribed period and then the second word line corresponding to the selected row is activated for the second prescribed period regardless of data type. Therefore, circuitry related to row decoding can be simplified since circuitry for determining data type is not required in the circuitry related to row decoding. Further, layout area can be reduced dramatically since block division and arrangement of a row decoder for every IO are unnecessary.

Further, the static type semiconductor memory device according to the present invention includes the memory cell provided with the first and second bipolar transistors. Therefore, sufficient static noise margin can be ensured without increasing the area, and sufficient static noise margin can also be ensured even if low supply potential is used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
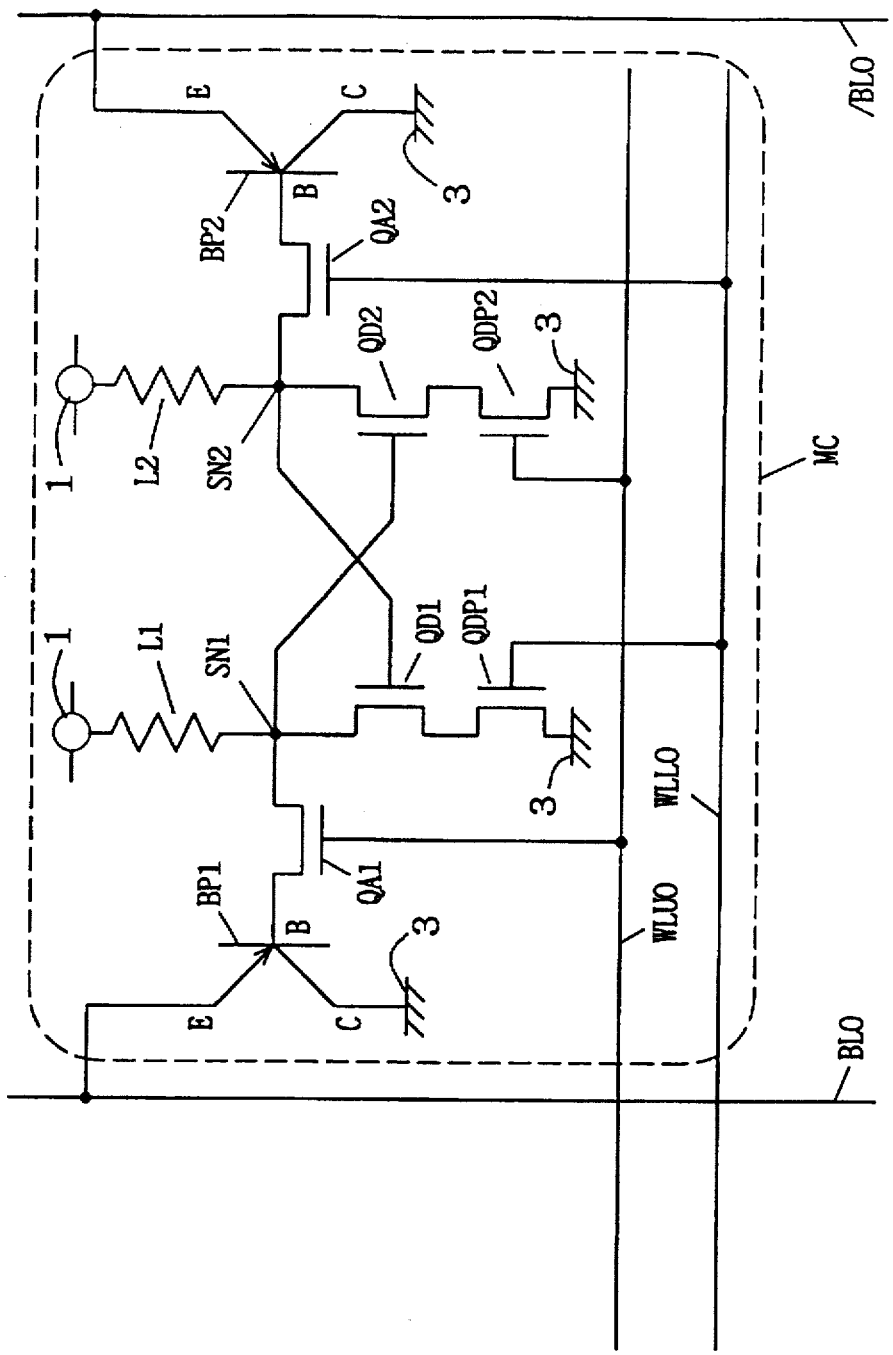
FIG. 1 is a circuit diagram showing details of the memory cell of the SRAM according to the first embodiment of the present invention.

FIG. 1 is a circuit diagram illustrating in detail a memory cell of a static random access memory (hereinafter referred to as "SRAM") as a static type semiconductor memory device according to the first embodiment of the present invention. Referring to FIG. 1, the memory cell MC is provided with bipolar transistors BP1, BP2, load elements L1, L2, access transistors QA1, QA2, driver transistors QD1, QD2, and depletion type transistors QDP1, QDP2. Bipolar transistors BP1 and BP2 are of PNP type. Access transistors QA1, QA2, driver transistors QD1, QD2 and depletion type transistors QDP1, QDP2 are NMOS transistors. Load elements L1 and L2 are high resistance elements. Sufficient static noise margin can thus be ensured without increasing the area and sufficient static noise margin can also be maintained ensured even if low supply potential is utilized, by providing bipolar transistors BP1 and BP2.

Load element L1 is provided between a node receiving supply voltage Vcc from a power supply 1 and storage node SN1. Load element L2 is provided between a node receiving supply voltage Vcc from supply 1 and storage node SN2. Access transistor QA1 is placed between the base of bipolar transistor BP1 and storage node SN1 and has its gate connected to a word line WLU0. Access transistor QA2 is provided between storage node SN2 and the base of bipolar transistor BP2 and has its gate connected to a word line WLL0. Bipolar transistor BP1 is placed between a bit line BL0 and a node receiving ground voltage GND from ground 3. Bipolar transistor BP2 is placed between a bit line /BL0 and a node receiving ground voltage GND from ground 3.

Driver transistor QD1 is placed between storage node SN1 and depletion type transistor QDP1 and has its gate connected to storage node SN2. Driver transistor QD2 is placed between storage node SN2 and depletion type transistor QDP2 and has its gate connected to storage node SN1. Depletion type transistor QDP1 is placed between driver transistor QD1 and a node receiving ground voltage GND from ground 3, and has its gate connected to word line WLL0. Depletion type transistor QDP2 is provided between driver transistor QD2 and a node receiving ground voltage GND from ground 3, and has its gate connected to word line WLU0. The word line connected to the gates of access transistor QA1 and depletion type transistor QDP2 is often referred to as an upper side word line, and the word line connected to the gates of access transistor QA2 and depletion type transistor QDP1 is often referred to as a lower side word line.

Figure 2:
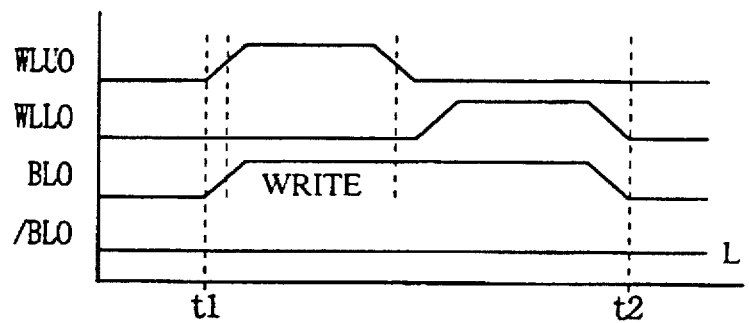
FIG. 2 is a timing chart related to write operation ("1" write) of the SRAM according to the first embodiment of the present invention.

Description of write operation is now given. With reference to FIGS. 1 and 2, suppose that data "1" is written, that is, the potentials on storage nodes SN1 and SN2 are respectively set to "H" and "L" levels. Row select operation is conducted using two word lines WLU0 and WLL0. In other words, two word lines are provided for one row. At the time of selection, the potential on the upper side word line WLU0 is set to "H" level, and the potential on the lower side word line WLL0 is thereafter set to "H" level. One cycle is from setting the potential on the upper side word line WLU0 to "H" level to setting the potential on the lower side word line WLL0 to "L" level, that is, from time t1 to t2.

The potentials on bit line pair BL0, /BL0 corresponding to a non-selected column are set to low level, for example, 0V. The potential on the bit line BL0 corresponding to a selected column for writing is set to "H" level for one cycle (from time t1 to t2). The potential on the bit line /BL0 corresponding to a selected column for writing is constantly set to "L" level for one cycle (from time t1 to t2). In the memory cell MC to be selected, the potential on the word line WLU0 is first set to "H" level, so that access transistor QA1 is turned on and depletion type transistor QDP2 is strongly turned on. On the other hand, access transistor QA2 is turned off, and depletion type transistor QDP1 is weakly turned on. That the depletion type transistor QDP2 is "strongly turned on" is relative to depletion type transistor QDP1 which is "weakly turned on", and it is not related to other transistors (access transistor, driver transistor and so on).

Since the potential on the bit line BL0 connected to the memory cell MC to be selected is at high level, the base potential of bipolar transistor BP1 is the potential on the bit line BL0 minus emitter-base voltage Vbe, because of PN diode between emitter and base. Accordingly, current flows from emitter E to collector C and base B. The current ratio between the base current and the collector current at this time is provided by the current amplification factor of bipolar transistor BP1. Usually the collector current is dominant in the ratio.

Such base current flows into storage node SN1 of the memory cell and increases the potential on the storage node SN1. When the potential on the storage node SN1 exceeds threshold voltage of driver transistor QD2, driver transistor QD2 having its gate connected to storage node SN1 is turned on. Accordingly, the potential on storage node SN2, that is, drain potential of driver transistor QD2 decreases, and driver transistor QD1 having its gate connected to storage node SN2 is turned off.

Write operation for data "1" is thus completed while the potential on the word line WLU0 remains at "H" level. Actually the write operation into the memory cell is carried out only while word line WLU0 is at "H" level. While word line WLL0 is at "H" level, bit line /BL0 is at "L" level, so that there would be no erroneous write operation. While word line WLU0 is at "H" level, depletion type transistor QDP1 is weakly turned on. At this time, if the potential on word line WLU0 becomes "L" level from "H" level, access transistor QA1 is turned off. Accordingly, the base current of bipolar transistor BP1 is cut off, and the collector current is also cutoff. Large amount of current temporarily flows from emitter E to collector C of bipolar transistor BP1. However, this current is cut off immediately after writing. On the other hand, the potential on bit line /BL0 is at low level during one cycle, so that bipolar transistor BP2 is not turned on.

Figure 3:
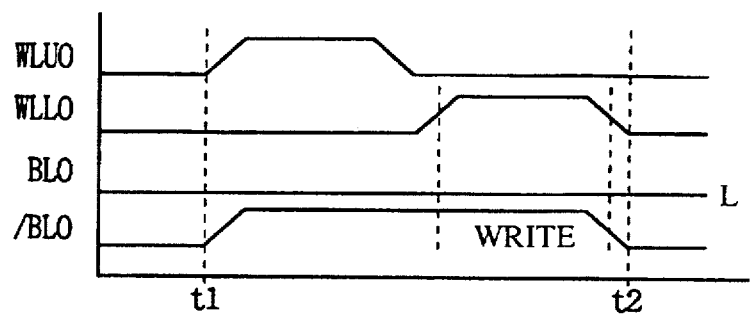
FIG. 3 is a timing chart related to write operation ("0" write) of the SRAM according to the first embodiment of the present invention.

Referring to FIG. 3, when data "0" is written, that is, the potentials on storage node SN1 and SN2 are respectively set to "L" and "H" levels, the potentials on bit lines /BL0 and BL0 are respectively set to high and low levels during one cycle (time t1 to t2). First, the potential on the upper side word line WLU0 is set to "H" level, and then the potential on the lower side word line WLL0 is set to "H" level. Actually, data is written while word line WLL0 is set to "H" level.

In the write operation, the potential on the upper side word line WLU0 and the potential on the lower side word line WLL0 are set to "H" level in the same order for one cycle regardless of the type of write data. The reason why the potentials on the two word lines WLU0 and WLL0 are set to "H" level at different timings is as follows. Suppose that when the potentials on storage nodes SN1 and SN2 are respectively at "L" and "H" levels, these are reset to respectively "H" and "L" levels. At this time, if there are not depletion type transistors QDP1 and QDP2, driver transistor QD1 is ON immediately after the start of the write operation. Therefore, transition of the potential on storage node SN1 to "H" level is delayed. To solve this problem, depletion type transistors QDP1 and QDP2 are provided, depletion type transistor QDP1 corresponding to the side for setting the potential on the storage node to "H" level is weakly turned on, so that latch is easily inverted. Accordingly, the potentials on two word lines WLU0 and WLL0 cannot be set to "H" level at the same time, and they are set to "H" level at different timings.

Figure 4:
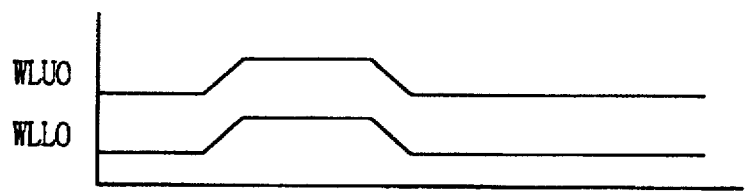
FIG. 4 is a timing chart related to read operation of the SRAM according to the first embodiment of the present invention.

Read operation is next described. FIG. 4 is a timing chart relating to read operation of the SRAM according to the first embodiment of the present invention. Suppose that potentials on storage nodes SN1 and SN2 are respectively set to "H" and "L" levels. At the start of read operation, two word lines WLU0 and WLL0 are set to "H" level simultaneously. Then, access transistors QA1 and QA2 are turned on. On the other hand, before read operation is started, bit line pair BL0, /BL0 is precharged to "L" level, and the potentials on bit line pair BL0, /BL0 are pulled up to "H" level by current source (not shown) as read operation is started. In other words, suitable amount of current is applied to bit line pair BL0, /BL0 from the current source. From this current, current determined by current amplification factor of bipolar transistor BP2 flows into the memory cell via base B of bipolar transistor BP2. Therefore, value of current of the current source should be set such that it would not destroy data in the memory cell. In FIG. 1, the current source supplies current of 200 μA to bit line pair BL0, /BL0. It is assumed that 10 percent of this current (emitter current), that is, 20 μA, flows into the memory cell.

At this time, driver transistor QD2 is turned on, while driver transistor QD1 is turned off. Base current flows to bipolar transistor BP2 connected to driver transistor QD2 which is turned on. Bipolar transistor BP2 is turned on and current from the current source flows into the memory cell. Potential on bit line /BL0 is decreased. On the other hand, potential on bit line BL0 increases since bipolar transistor BP1 is not turned on. Accordingly, potential difference between paired bit lines BL0 and /BL0 is generated. Sensing and amplification of the potential difference by a sense amplifier (not shown) allows data in the memory cell to be read.

Figure 5:
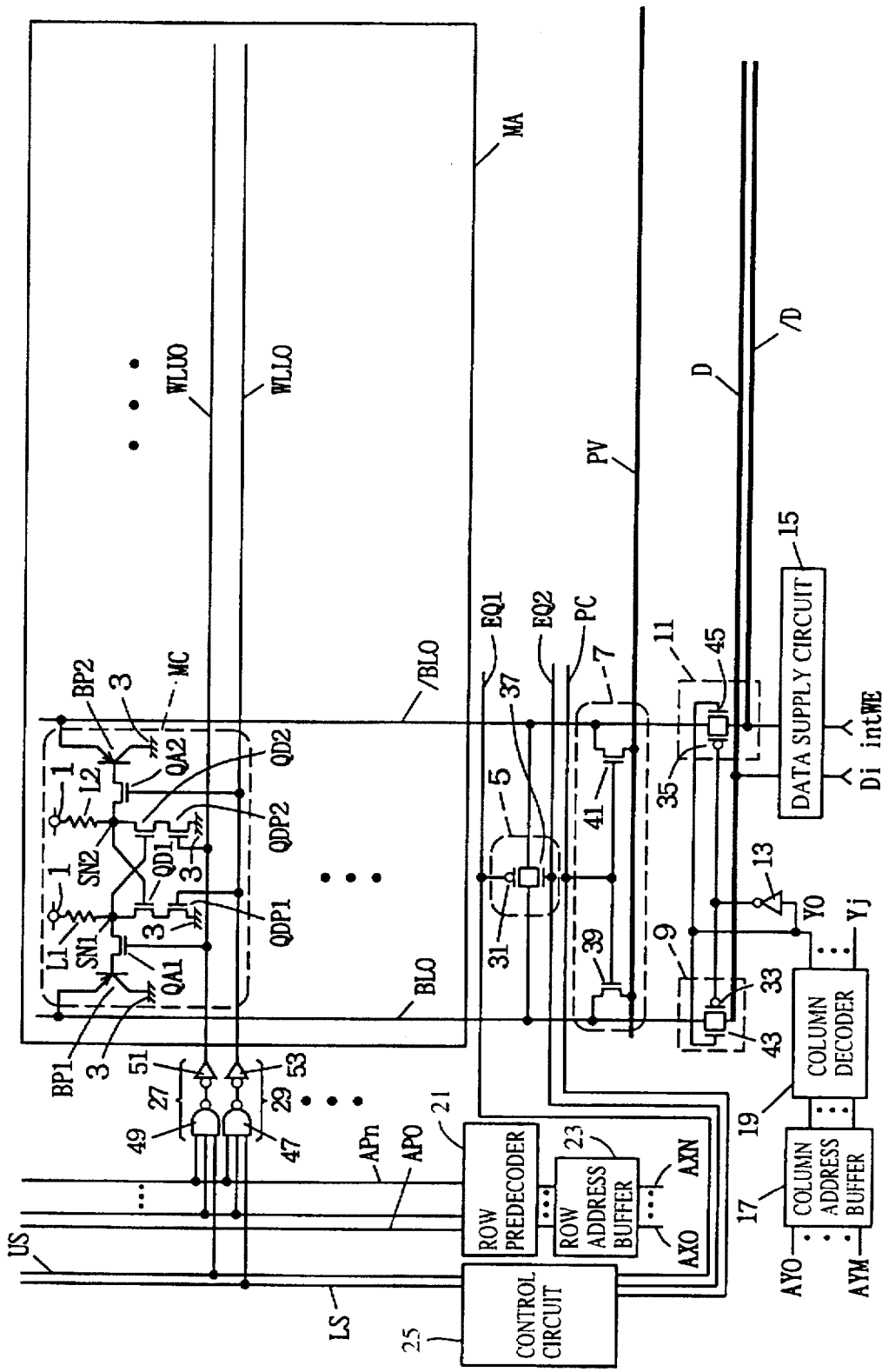
FIG. 5 is a schematic block diagram showing an entire structure of the SRAM according to the first embodiment of the present invention.

FIG. 5 is a schematic block diagram showing an entire structure of the SRAM according to the first embodiment of the present invention. The parts identical to those in FIG. 1 have the same reference characters and the description of them is not repeated. Referring to FIG. 5, the SRAM is provided with a plurality of memory cells MC arranged in a matrix of rows and columns. The plurality of memory cells MC constitute a memory cell array MA. Corresponding to a plurality of rows, a plurality of word lines WLU0-WLUJ (J is a natural number) as well as a plurality of word lines WLL0-WLLJ (J is a natural number) are disposed. Memory cells MC of corresponding row is connected to each of word lines WLU0-WLUJ and each of WLL0-WLLJ. A plurality of bit line pairs BL0, /BL0-BLj, /BLj (j is a natural number) are arranged corresponding to a plurality of columns.

The SRAM further includes a plurality of local decoders 27 corresponding to the plurality of word lines WLU0-WLUJ. In addition, a plurality of local decoders 29 corresponding to the plurality of word lines WLL0-WLLJ are provided. The SRAM further includes a plurality of equalize circuits 5, a plurality of precharge circuits 7, and a plurality of inverters 13 corresponding to the plurality of bit line pairs BL0, /BL0-BLj, /BLj. In addition, a plurality of transfer gates 9 are provided corresponding to the plurality of bit lines BL0-BLj. A plurality of transfer gates 11 are also provided corresponding to the plurality of bit lines /BL0-/BLj. The SRAM further includes a control circuit 25, a row predecoder 21, a row address buffer 23, a column address buffer 17, a column decoder 19 and a data supply circuit 15.

Local decoder 27 is constituted by an NAND circuit 49 and an inverter 51. Local decoder 29 is constituted by an NAND circuit 47 and an inverter 53. Equalize circuit 5 is constituted by a PMOS transistor 31 and an NMOS transistor 37. Precharge circuit 7 is constituted by two NMOS transistors 39 and 41. Transfer gate 9 is constituted by an NMOS transistor 43 and a PMOS transistor 33. Transfer gate 11 is constituted by a PMOS transistor 35 and an NMOS transistor 45.

A row corresponding to word lines WLU0, WLL0 and a column corresponding to bit line pair BL0, /BL0 are now considered. An input node of inverter 51 of local decoder 27 is connected to an output node of NAND circuit 49. An output node of inverter 51 is connected to corresponding upper side word line WLU0. Corresponding two signals among row predecode signals AP0-APn as well as a word line switching signal US are input to NAND circuit 49. An input node of inverter 53 of local decoder 29 is connected to an output node of NAND circuit 47. An output node of inverter 53 is connected to corresponding lower side word line WLL0. A word line switching signal LS as well as two row predecode signals that are the same as the two row predecode signals supplied to NAND circuit 49 of corresponding local decoder 27 are input to NAND circuit 47 of local decoder 29.

PMOS transistor 31 of equalize circuit 5 is arranged between corresponding bit lines BL0 and /BL0, and has its gate connected to an equalize signal line EQ1. NMOS transistor 37 is placed between corresponding bit lines BL0 and /BL0, and has its gate connected to an equalize signal line EQ2. NMOS transistor 39 of precharge circuit 7 is disposed between corresponding bit line BL0 and a precharge voltage supply line PV, and has its gate connected to a precharge signal line PC. NMOS transistor 41 is provided between corresponding bit line /BL0 and precharge voltage supply line PV, and has its gate connected to precharge signal line PC.

NMOS transistor 43 of transfer gate 9 is provided between corresponding bit line BL0 and a data line D, and corresponding column select signal Y0 is supplied to its gate. PMOS transistor 33 is provided between corresponding bit line BL0 and data line D, and the gate thereof receives a signal which is generated by inverting corresponding column select signal Y0. NMOS transistor 45 of transfer gate 11 is placed between corresponding bit line /BL and data line /D, and corresponding column select signal Y0 is supplied to its gate. PMOS transistor 35 is placed between corresponding bit line /BL0 and data line /D, and the gate thereof receives a signal which is generated by inverting corresponding column select signal Y0. An equalize signal EQ1, an equalize signal EQ2, and precharge signal PC are respectively supplied to equalize signal line EQ1, equalize signal line EQ2, and precharge signal line PC.

Figure 6:
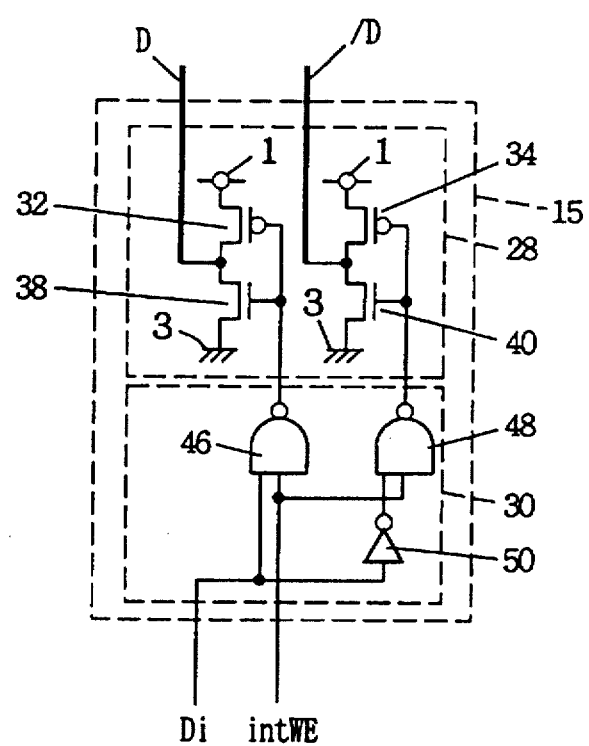
FIG. 6 is a circuit diagram showing the data supply circuit of FIG. 5 in detail.

FIG. 6 is a circuit diagram showing data supply circuit 15 of FIG. 5 in detail. The parts identical to those in FIG. 5 have the same reference characters and the description thereof is not repeated. With reference to FIG. 6, data supply circuit 15 is constituted by a write buffer 28 and a write data control circuit 30. Write buffer 28 includes PMOS transistors 32, 34, and NMOS transistors 38, 34. Write data control circuit 30 includes NAND circuits 46, 48 and an inverter 50.

PMOS transistor 32 and NMOS transistor 38 of write buffer 28 are connected in series between a node receiving supply voltage Vcc from power supply 1 and a node receiving ground voltage GND from ground 3. The gates of NMOS transistor 38 and PMOS transistor 32 are connected to an output node of NAND circuit 46. The drain of NMOS transistor 38 is connected to data line D. PMOS transistor 34 and NMOS transistor 40 are connected in series between a node receiving supply voltage Vcc from power supply 1 and a node receiving ground voltage GND from ground 3. The gates of PMOS transistor 34 and NMOS transistor 40 are connected to an output node of NAND circuit 48. The drain of NMOS transistor 40 is connected to data line /D. An internal write enable signal intWE and data Di are supplied to NAND circuit 46 of write data control circuit 30. NAND circuit 48 receives internal write enable signal intWE and a signal which is generated by inverting data Di by inverter 50.

Figure 7:
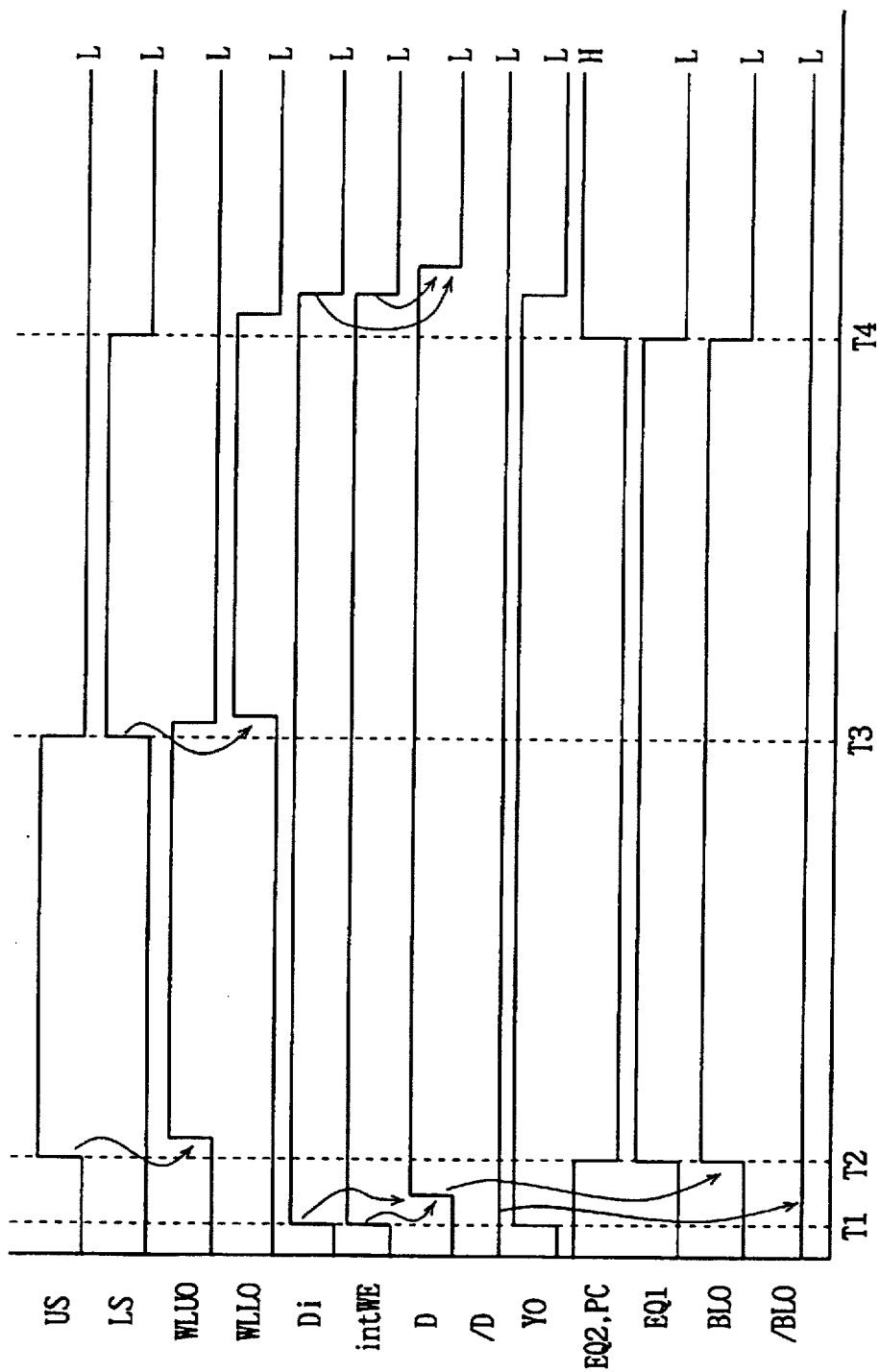
FIG. 7 is a timing chart specifically showing the write operation ("1" write) of the SRAM according to the first embodiment of the present invention.

FIG. 7 is a timing chart showing the details of write operation ("1" write) of the SRAM according to the first embodiment of the invention. With reference to FIGS. 5-7, description is now given of the case in which data "1" is written into memory cell MC connected to bit line pair BL0, /BL0 and word lines WLU0, WLL0, that is, the potentials on storage nodes SN1 and SN2 are respectively set to "H" and "L" levels. At time T1, when data Di of "H" level and internal write enable signal intWE of "H" level are supplied to data supply circuit 15, NMOS transistor 38 is turned off, PMOS transistor 32 is turned on, so that the potential on data line D becomes "H" level. On the other hand, PMOS transistor 34 is turned off, NMOS transistor 40 is turned on, and the potential on data line/D becomes "L" level.

At time T1, when column select signal Y0 becomes "H" level, transfer gates 9, 11 are turned on, bit line BL0 and data line D are connected together, and bit line /BL0 and data line /D are connected together. At time T2, equalize signal EQ2 and precharge signal PC attain "L" level, and equalize signal EQ1 attains "H" level. Therefore, equalize circuit 5 and precharge circuit 7 turn off, and precharge and equalize operations stop. Accordingly, the potentials on bit lines BL0 and /BL0 respectively attain "H" and "L" levels.

When not selected, equalize signal EQ2 and precharge signal PC are at "H" level, and equalize signal EQ1 is at "L" level, so that equalize circuit 5 and precharge circuit 7 are on, and the potentials on bit line pair BL0, /BL0 are at "L" level. The potential of "L" level is supplied from a precharge voltage supply line PV to bit line pair BL0, /BL0.

When two predecode signals supplied to NAND circuit 49 corresponding to word line WLU0 are both at "H" level, and word line switching signal US becomes "H" level at time T2, the potential on word line WLU0 correspondingly attains "H" level. On the other hand, at time T2, word line switching signal LS is at "L" level, and the potential on word line WLL0 is at "L" level. If two predecode signals supplied to NAND circuit 49 corresponding to word line WLU0 as well as two predecode signals supplied to NAND circuit 47 corresponding to word line WLL0 are all at "H" level, a row corresponding to word lines WLU0 and WLL0 is selected.

At time T3, when word line switching signal US attains "L" level from "H" level, the potential on word line WLU0 correspondingly attains "L" level. When two predecode signals supplied to NAND circuit 47 corresponding to word line WLL0 are both at "H" level, and at time T3, word line switching signal LS attains "H" level, the potential on word line WLL0 correspondingly attains "H" level. At time T3, the potential on word line WLU0 is at "L" level since word line switching signal US is at "L" level.

When word line switching signal LS attains "L" level at time T4, the potential on word line WLL0 correspondingly attains "L" level. On the other hand, at time T4, equalize signal EQ2 and precharge signal PC attain "H" level, and equalize signal EQ1 attains "L" level. Accordingly, equalize circuit 5 and precharge circuit 7 turn on, and the potentials on bit line pair BL0, /BL0 are set to "L" level. An operation after time T4 is hereinafter described. When data Di and internal write enable signal intWE attain "L" level, NMOS transistor 38 turns on, so that the potentials on data line /D as well as data line D attain "L" level.

As for a method for weakly turning on either of depletion type transistors QDP1 or QDP2 which set the potential on the storage node of the memory cell to "H" level, either of depletion type transistors QDP1 or QDP2 could be turned off corresponding to the type of write data. However, some additional circuit for determining the type of the written data is required in a circuit relating to row decoding, so that the circuit related to row decoding becomes complex. In the SRAM according to the first embodiment of the invention, upper side word line WLU0 and lower side word line WLL0 are set to "H" level in the same order. Accordingly, the circuit related to decoding can be simplified in the SRAM of the first embodiment of the invention. The layout area can be significantly reduced since there is no need of block division and arranging of a local decoder for every IO.

Figure 8:
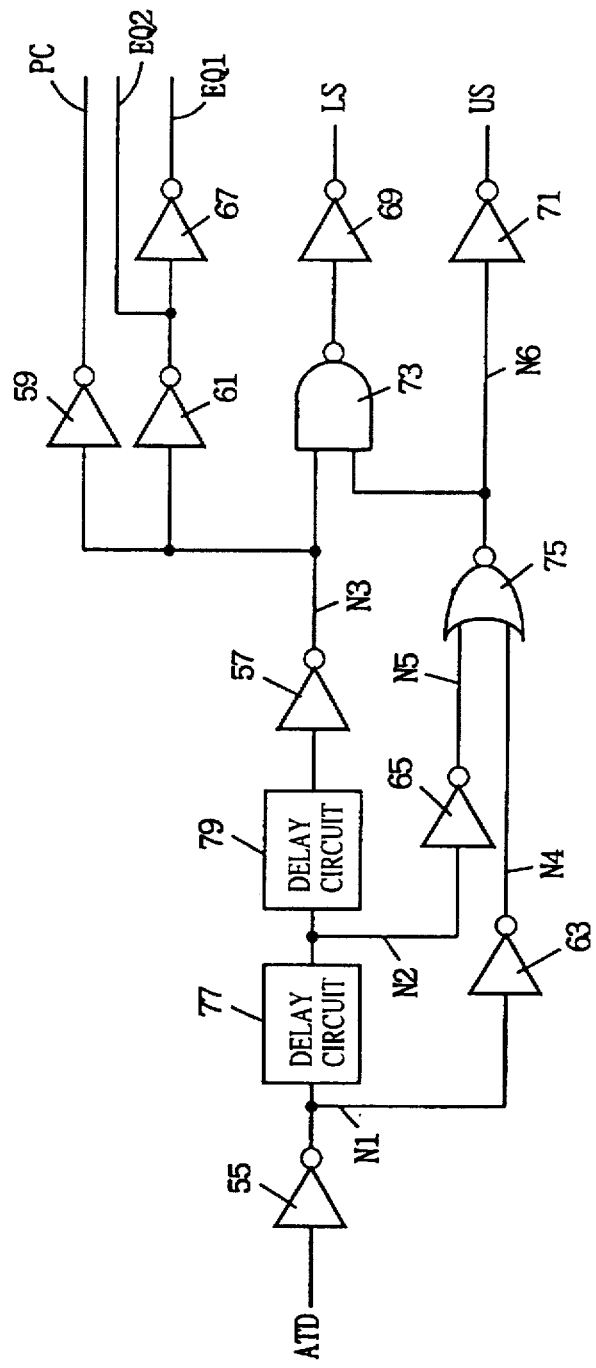
FIG. 8 is a circuit diagram showing details of the control circuit of FIG. 5.

FIG. 8 is a circuit diagram showing details of control circuit 25 of FIG. 5. The parts similar to those of FIG. 5 have the same reference characters, and the description thereof is not repeated. Referring to FIG. 8, the control circuit includes inverters 55, 57, 59, 61, 63, 65, 67, 69, and 71, delay circuits 77, 79, an NAND circuit 73, and an NOR circuit 75. An output node of inverter 55 is connected to node N1. An ATD (Address Transition Detection) signal is supplied to inverter 55. ATD signal is a one-shot high level pulse generated in address transition.

Delay circuit 77 is provided between nodes N1 and N2. Delay circuit 79 is provided between node N2 and an input node of inverter 57. Inverter 57 is arranged between delay circuit 79 and node N3. Inverter 59 is arranged between node N3 and precharge signal line PC. Inverter 61 is provided between node N3 and equalize signal line EQ2. Inverter 67 is provided between equalize signal line EQ2 and equalize signal line EQ1.

Inverter 63 is placed between nodes N1 and N4. Inverter 65 is placed between nodes N2 and N5. One input node and the other input node of NOR circuit 75 are respectively connected to node N5 and node N4, and an output node thereof is connected to node N6. Inverter 71 is placed between node N6 and word line switching signal line US. One input node, the other input node, and an output node of NAND circuit 73 are respectively connected to nodes N3, N6, and an input node of inverter 69. Inverter 69 is placed between NAND circuit 73 and word line switching signal line LS. Inverter 59 outputs precharge signal PC to precharge signal line PC. Inverter 61 outputs equalize signal EQ2 to equalize signal line EQ2. Inverter 67 outputs equalize signal EQ1 to equalize signal line EQ1. Inverter 69 outputs word line switching signal LS to word line switching signal line LS. Inverter 71 outputs word line switching signal US to word line switching signal line US.

Figure 9:
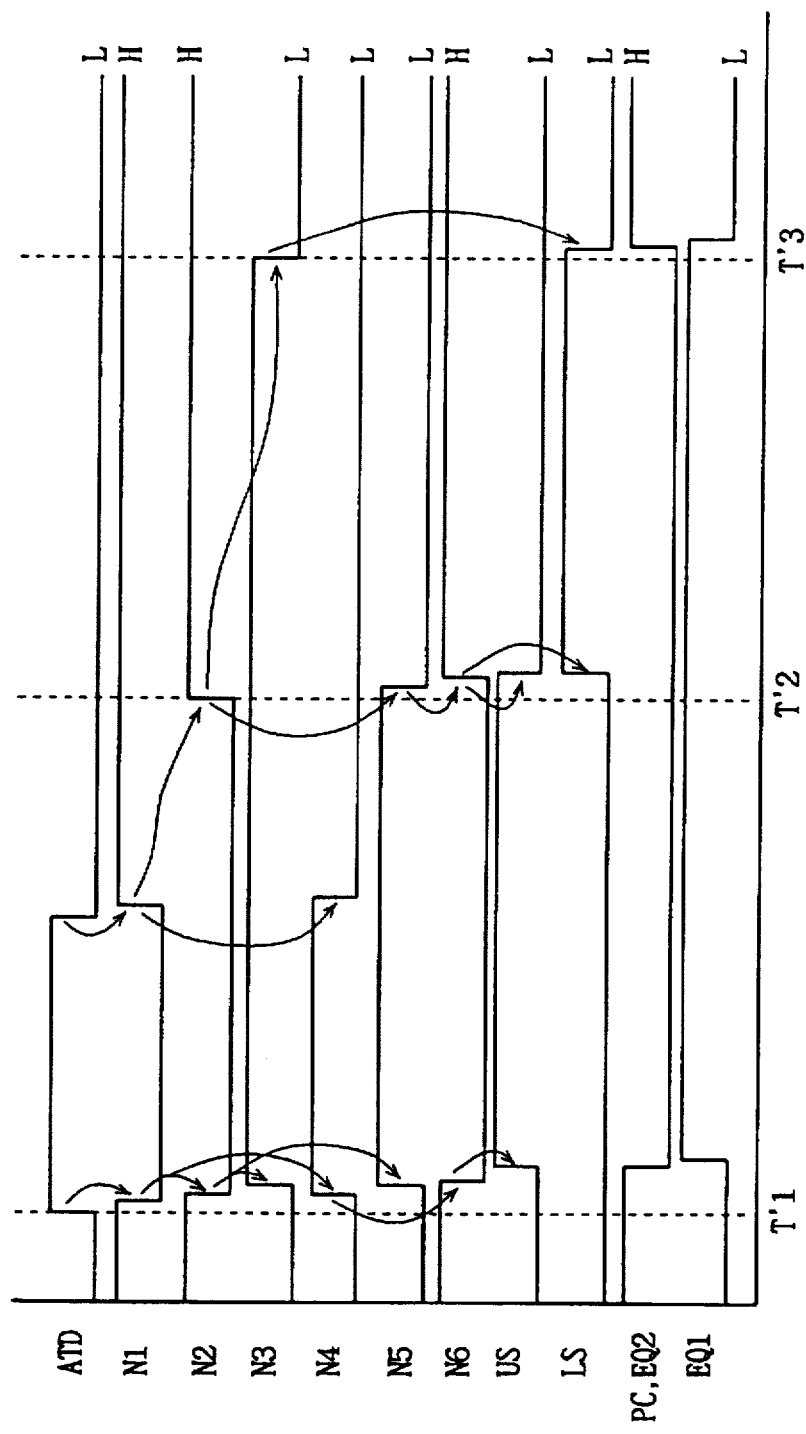
FIG. 9 is a timing chart related to operation of the control circuit of FIG. 8.

FIG. 9 is a timing chart related to an operation of the control circuit of FIG. 8. With reference to FIGS. 8 and 9, the operation of the control circuit of FIG. 8 will be described. Delay circuits 77 and 79 delay transition to "H" level. Following the rising edge of ATD signal at time T'1, transition of the potential on node N1 to "L" level occurs.

Following the falling edge of the potential on node N1, transition of the potential on node N4 to "H" level occurs. Following the rising edge of the potential on node N4, transition of the potential on node N6 to "L" level occurs. Following the falling edge of the potential on node N6, the potential on word line switching signal line US becomes "H" level. In other words, word line switching signal US output from inverter 71 attains "H" level.

Transition of the potential on node N2 to "H" level is delayed by delay circuit 77 compared with the transition of the potential on node N1 (time T'2). Following the rising edge of the potential on node N2, transition of the potential on node N5 to "L" level occurs. Following the falling edge of the potential on node N5, transition of the potential on node N6 to "H" level occurs. Following the rising edge of the potential on node N6, transitions of the potentials on word line switching signal lines US and LS respectively to "L" and "H" levels occur. In other words, following the rising edge of the potential on node N6, inverter 71 outputs word line switching signal US of "L" level, and inverter 69 outputs word line switching signal LS of "H" level. Transition of the potential on node N3 to "L" level is delayed by delay circuit 79 compared with the transition of the potential on node N2 to "H" level (time T'3). Following the falling edge of the potential on node N3 at time T'3, the potential on word line switching signal line LS attains "L" level. Inverter 69 thus outputs word line switching signal LS of "L" level following the falling edge of the potential on node N3.

Following the rising edge of ATD signal at time T'1, transition of the potential on node N3 to "H" level occurs. Following the rising edge of the potential on node N3, the potentials on precharge signal line PC and equalize signal line EQ2 attains "L" level. Following the falling edge of equalize signal line EQ2, equalize signal line EQ1 attains "H" level. At time T'3, following the falling edge of the potential on node N3, transition of the potentials on precharge signal line PC and equalize signal line EQ2 to "H" level occur. Following the rising edge of equalize signal line EQ2, transition of the potential on equalize signal line EQ1 to "L" level occurs.

Figure 10:
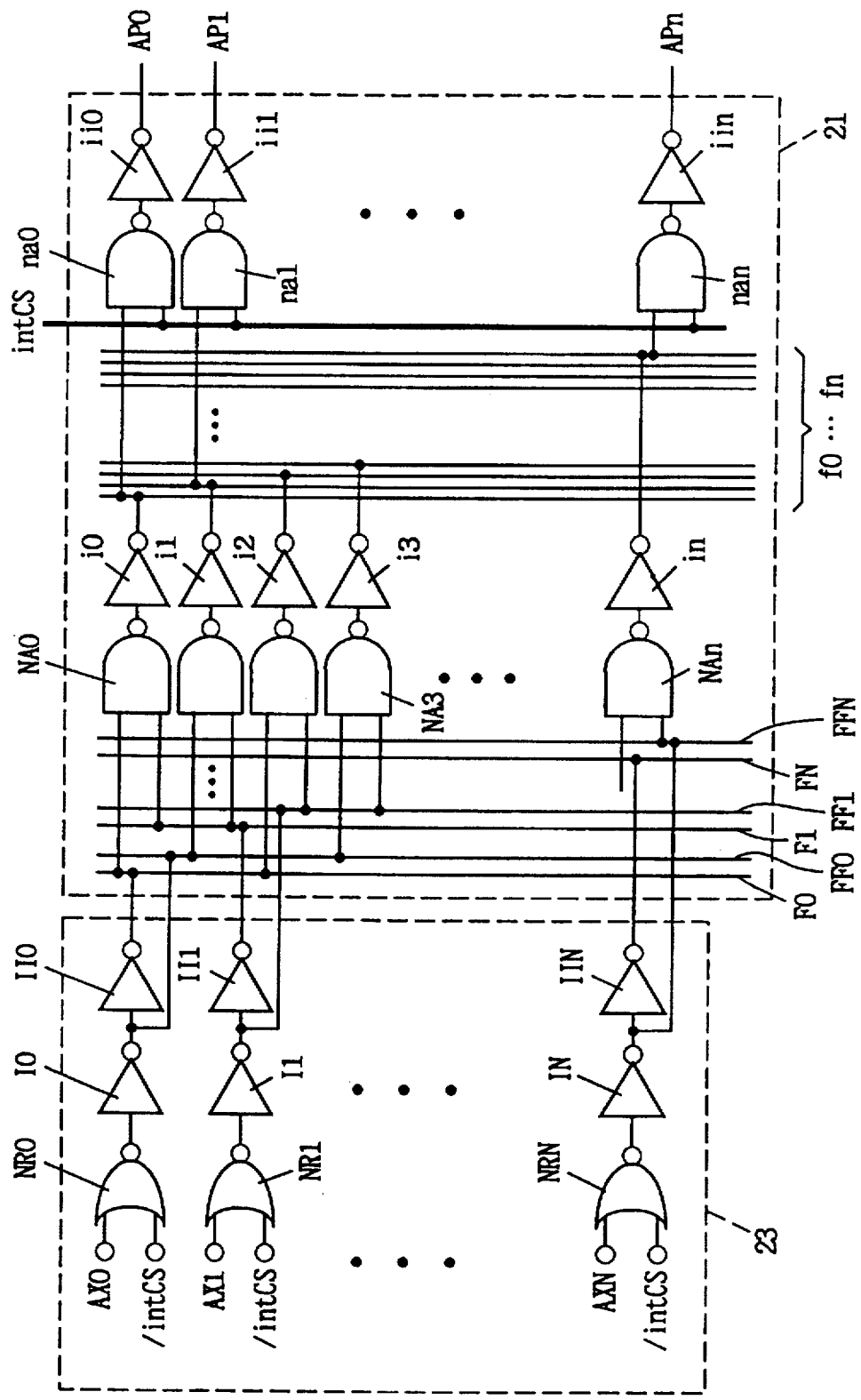
FIG. 10 is a circuit diagram illustrating details of the row predecoder and the row address buffer of FIG. 5.

FIG. 10 is a circuit diagram illustrating details of row predecoder 21 and row address buffer 23 of FIG. 5. The parts identical to those of FIG. 5 have the same reference characters and the description thereof is not repeated. Referring to FIG. 10, row address buffer 23 is provided with NOR circuits NR0-NRN (N is a natural number), inverters I0-IN and inverters II0-IIN. One input node of each of NOR circuits NR0-NRN receives internal chip select signal /intCS. The SRAM is selected when internal chip select signal /intCS is at "L" level. The other input node of each of NOR circuits NR0-NRN receives corresponding one of row address signals AX0-AXN. Input nodes of inverters I0-IN are connected to output nodes of corresponding NOR circuits NR0-NRN. Output nodes of inverters I0-IN are connected to input nodes of corresponding inverters II0-IIN. Output nodes of inverters I0-IN are connected to corresponding signal lines F0-FN. Output nodes of inverters II0-IIN are connected to corresponding signal lines FF0-FFN.

Row predecoder 21 includes NAND circuits NA0-NAn (n is a natural number), NAND circuits na0-nan and inverters i0-in, ii0-iin. Input nodes of NAND circuits NA0-NAn are connected to corresponding signal lines F0-FN, FF0-FFN. Output nodes of NAND circuits NA0-NAn are connected to input nodes of corresponding inverters i0-in. Output nodes of inverters i0-in are connected to corresponding signal lines f0-fn. One input node of each of NAND circuits na0-nan receives internal chip enable signal intCS, and the other input node thereof is connected to corresponding one of signal lines f0-fn. When internal chip enable signal intCS is at "H" level, the SRAM is selected. Output nodes of NAND circuits na0-nan are connected to input nodes of corresponding inverters ii0-iin. Output nodes of inverters ii0-iin are connected to corresponding row predecode signal lines AP0-APn. Inverters ii0-iin thus output predecode signals AP0-Apn.

Row predecoder 21 outputs row predecode signals AP0-APn for selecting any of the rows according to the combination of the levels of row address signals AX0-AXn supplied to row address buffer 23. Column decoder 19 outputs column select signals Y0-Yj (j is a natural number) for selecting any of the columns according to the combination of the levels of column address signals AY0-AYM (M is a natural number) supplied to column address buffer 17.

Figure 11:
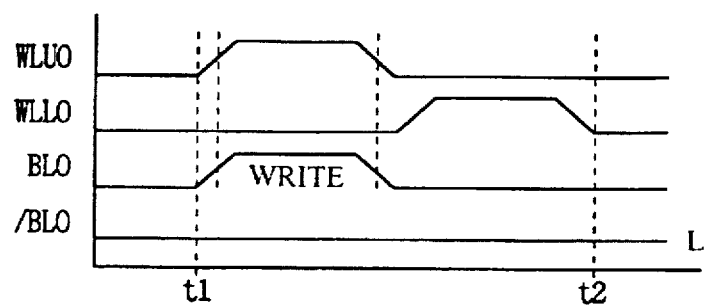
FIG. 11 is a timing chart related to the write operation ("1" write) of the modification of the SRAM according to the first embodiment of the present invention.

A modification of the SRAM according to the first embodiment of the invention is hereinafter described. A circuit structure of the modification of the SRAM according to the first embodiment is similar to that of the SRAM according to the first embodiment described above except for the circuit structure of data supply circuit 15 of FIG. 5. Write operation is accordingly different. FIG. 11 is a timing diagram related to write operation ("1" write) of the modification of the SRAM according to the first embodiment of the invention. Referring to FIGS. 5 and 11, a case in which data "1" is written into memory cell MC connected to bit line pair BL0, /BL0 and word lines WLU0, WLL0 will be described. First, word line WLU0 is set to "H" level, and word line WLL0 is set to "H" level. This operation is identical to that of the SRAM according to the first embodiment. The potential on bit line BL0 is set to "H" level while word line WLU0 is at "H" level. In the SRAM according to the first embodiment of the invention, the potential on bit line BL0 is set to "H" level during one cycle (time t1-t2) (see FIG. 2).

Figure 12:
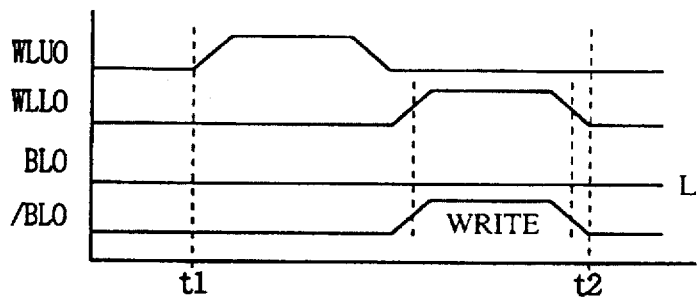
FIG. 12 is a timing chart related to the write operation ("0" write) of the modification of the SRAM according to the first embodiment of the present invention.

FIG. 12 is a timing chart related to write operation ("0" write) of the modification of the SRAM according to the first embodiment of the invention. First, word line WLU0 is set to "H" level, and word line WLL0 is set to "H" level. This operation is identical to that of the SRAM according to the first embodiment. The potential on bit line /BL0 is set to "H" level while word line WLL0 is at "H" level. In the SRAM of the first embodiment, the potential on bit line BL0 is set to "H" level during one cycle (time t1-t2) (see FIG. 3).

According to the modification of the SRAM of the first embodiment of the invention, while a word line which controls an access transistor connected to a storage node which sets the potential of "H" level is at "H" level, a bit line which sets the storage node to "H" level is set to "H" level.

Figure 13:
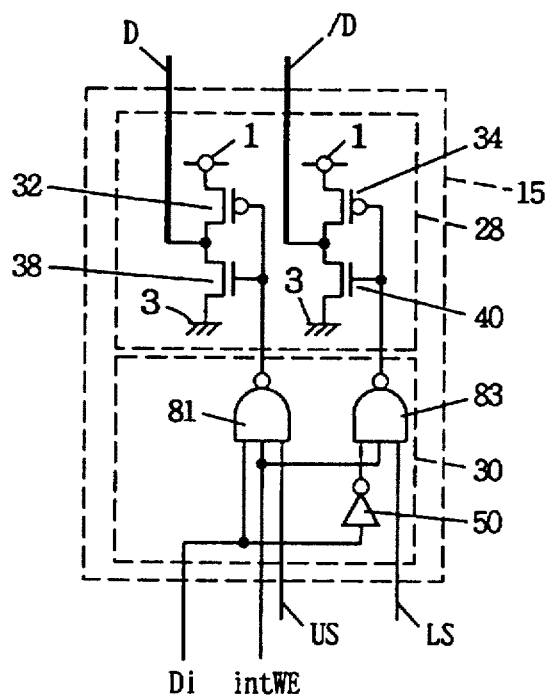
FIG. 13 is a circuit diagram specifically showing the data supply circuit (FIG. 5) utilized in the modification of the SRAM according to the first embodiment of the present invention.

FIG. 13 is a circuit diagram illustrating details of data supply circuit 15 (FIG. 5) utilized in the modification of the SRAM according to the first embodiment of the invention. The parts identical to those of FIG. 6 have the same reference characters and the description thereof is not repeated. Referring to FIG. 13, a write data control circuit 30 is constituted by NAND circuits 81, 83 and an inverter 50. An output node of NAND circuit 81 is connected to the gates of PMOS transistor 32 and NMOS transistor 38. Data Di, internal write enable signal intWE, and word line switching signal US are supplied to NAND circuit 81. An output node of NAND circuit 83 is connected to the gates of PMOS transistor 34 and NMOS transistor 40. To NAND circuit 83, a signal generated by inverting data Di by inverter 50, internal write enable signal intWE, and word line switching signal LS are supplied.

Figure 14:
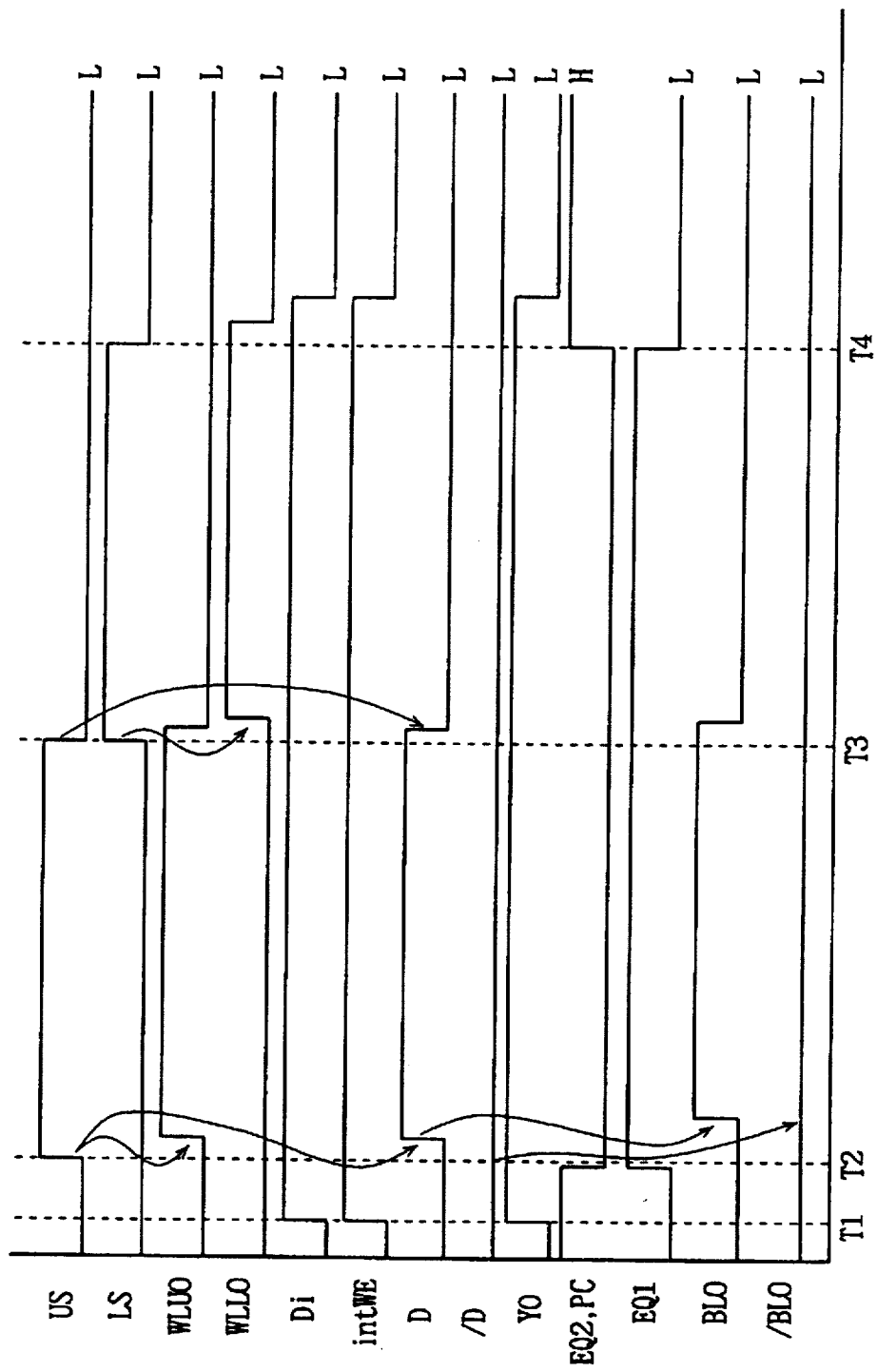
FIG. 14 is a timing chart specifically showing the write operation ("1" write) of the modification of the SRAM according to the first embodiment of the present invention.

FIG. 14 is a timing chart related to details of write operation ("1" write) in the modification of the SRAM according to the first embodiment of the invention. Signals and potentials which follow the transition of those in the first embodiment at the same timing have the same reference characters and the description thereof is not repeated. With reference to FIGS. 5, 13 and 14, when data Di and internal write enable signal intWE are at "H" level, transition of word line switching signal US to "H" level occurs at time T2, then PMOS transistor 32 turns on, and NMOS transistor 38 turns off. Accordingly, the potential on data line D attains "H" level. On the other hand, word line switching signal LS is at "H" level at time T2, so that PMOS transistor 34 turns off, and NMOS transistor 40 turns on. Accordingly, the potential on data line /D attains "L" level. Column select signal Y0 is at "H" level at time T2, so that transfer gates 9 and 11 turn on. Accordingly, the potential on bit line BL0 attains "H" level, and the potential on bit line /BL0 attains "L" level.

At time T3, when word line switching signal US attains "L" level, PMOS transistor 32 turns off, and NMOS transistor 38 turns on. Accordingly, the potential on data line D attains "L" level. On the other hand, at time T3, even if word line switching signal LS attains "H" level, data Di is at "H" level, so that PMOS transistor 34 turns off and NMOS transistor 40 turns on. Accordingly, the potential on data line /D remains at "L" level. At time T3, column select signal Y0 is at "H" level, and transfer gates 9, 11 turn on. Accordingly, the potential on bit line pair BL0, /BL0 is at "L" level.

According to the SRAM of the first embodiment of the invention and the modification thereof, the potentials on the upper side word line and the lower side word line are set to "H" level (activated) in the same order regardless of the type of data which is to be written. Therefore, a circuit which determines the type of written data is not necessary in a circuit related to row decoding, resulting in simplification of the circuit relating to row decoding. Further, the layout area can be dramatically reduced since block division and arrangement of a local decoder for every IO (Input/Output) are unnecessary.

[Second Embodiment]

Figure 15:
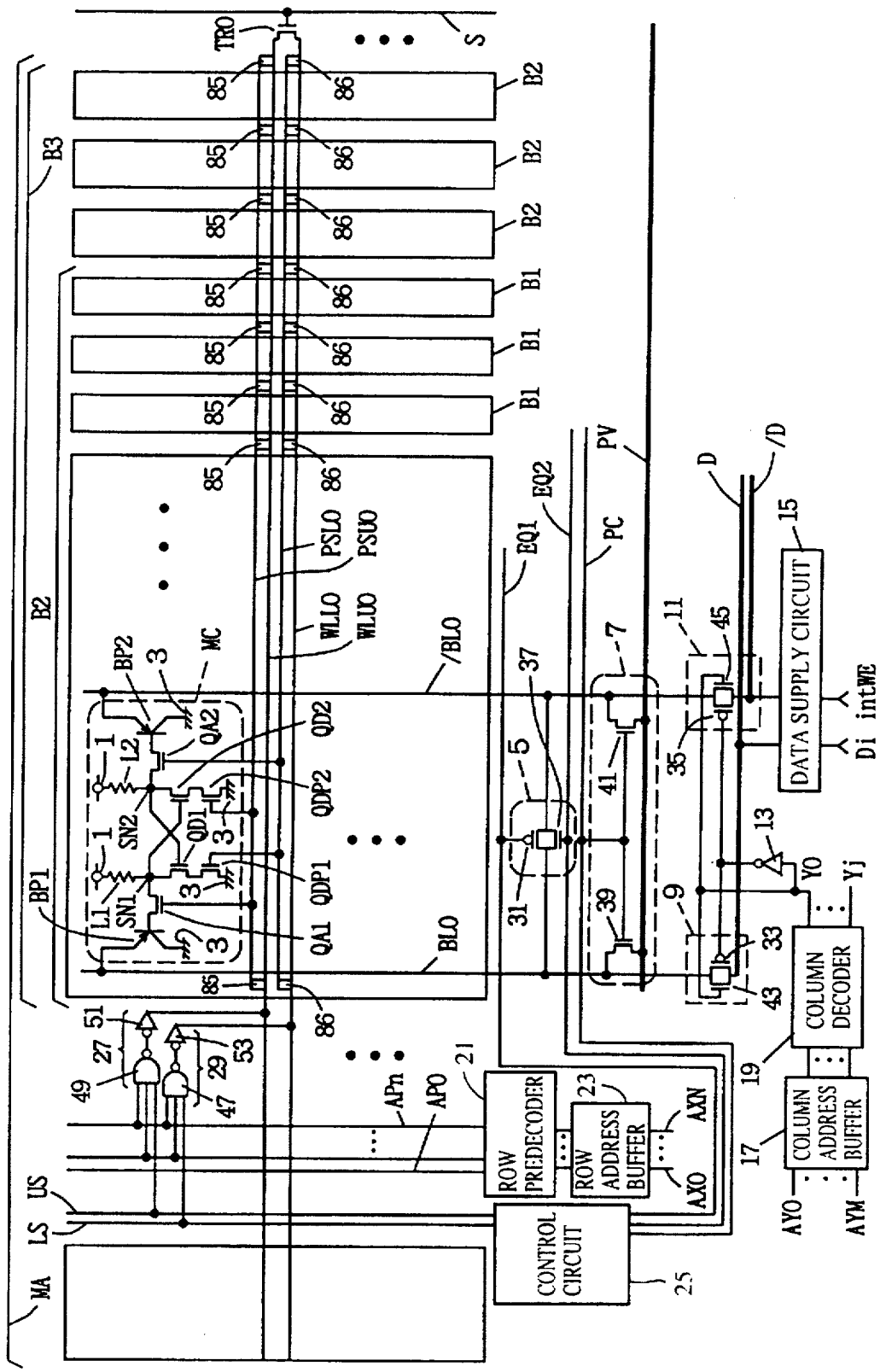
FIG. 15 is a schematic block diagram showing an entire structure of the SRAM according to the second embodiment of the present invention.

Write and read operations of an SRAM according to the second embodiment of the invention are similar to those of the SRAM according to the first embodiment. In the second embodiment, suppose that the SRAM is of 256 k bits. FIG. 15 is a schematic block diagram illustrating an entire structure of the SRAM according to the second embodiment of the invention. The parts similar to those of FIG. 5 have the same reference characters and the description thereof is not repeated.

With reference to FIG. 15, the SRAM includes memory cell array MA, control circuit 25, row predecoder 21, row address buffer 23, column address buffer 17, and column decoder 19. Memory cell array MA is constituted by 512 rows and 512 columns, and divided into two blocks B3. Each block B3 is constituted by 512 rows and 256 columns. Each block B3 is divided into four blocks B2. Each block B2 is constituted by 512 rows and 64 columns. Each block B2 is divided into four blocks B1. Each block B1 is constituted by 512 rows and 16 columns. Memory cell array MA is constituted by a plurality of memory cells MC arranged in a matrix of rows and columns.

In the SRAM, 512 word lines WLU0-WLU511 and 512 word lines WLL0-WLL511 are arranged corresponding to the 512 rows. Corresponding to the 512 columns, 512 bit line pairs BL0, /BL0-BL511, /BL511 are arranged. 512 memory cells MC in 512 columns are connected to each of word line pairs WLU0, WLL0-WLU511, WLL511, that is, one word line pair. Selection of a word line is not carried out hierarchically. A plurality of local decoders 27 are connected to corresponding plurality of word lines WLU0-WLU511. A plurality of local decoders 29 are connected to corresponding plurality of word lines WLL0-WLL511. A plurality of local decoders 27 and a plurality of local decoders 29 are placed in the central part of memory cell array MA. In other words, blocks B3 are arranged at both sides of a plurality of local decoders 27 and 29.

IO (input/output) 0-IO (input/output) 7 are provided corresponding to eight blocks B2. Specifically, I00 is provided corresponding to one block B2, I01 is provided corresponding to another block B2, I02 is provided corresponding to a third block B2, I03 is provided corresponding to a fourth block B2, I04 is provided corresponding to a fifth block B2, I05 is provided corresponding to a sixth block B2, I06 is provided corresponding to a seventh block B2, and I07 is provided corresponding to the other block B2. Accordingly, read and write of different data can be possible IO by IO. Eight sets of data line pairs D, /D are provided corresponding to eight blocks B2. In other words, one set of data line pair D, /D is shared by 64 columns. Eight data supply circuits 15 are provided corresponding to eight sets of data line pairs D, /D.

Word lines WLU0, WLL0, and memory cells MC connected to the word lines are now considered. Word lines WLU0, WLL0 are formed of aluminum interconnection at the second layer. The gates of access transistor QA1 and depletion type transistor QDP2 of memory cell MC are formed of polysilicon PSU0, and the gates of access transistor QA2 and depletion type transistor QDP1 are formed of polysilicon PSL0. Polysilicon PSU0 and word line WLU0 formed of the aluminum interconnection at the second layer are connected at a contact point 85 via an aluminum interconnection at the first layer. Similarly, polysilicon PSL0 and word line WLL0 formed of the aluminum interconnection at the second layer are connected at a contact point 86 via the aluminum interconnection at the first layer. Relations between the other word lines WLU1-WLU511, WLL1-WLL511 and memory cells MC connected to the word lines are identical to those described above.

A plurality of NMOS transistors TR0-TR511 are provided corresponding to a plurality of word line pairs WLU0, WLL0-WLU511, WLL511. For example, NMOS transistor TR0 is provided corresponding to one set of word line pair WLL0, WLU0. NMOS transistor TR0 is placed between word line WLU0 and word line WLL0, and has its gate connected to a control signal line S. The gates of all NMOS transistors TR0-TR511 are connected to one control signal line S. Threshold voltage of NMOS transistors TR0-TR511 is low.

A characteristic operation of the SRAM according to the second embodiment of the invention is now described. Word lines WLU0, WLL0 is considered. In data write operation, when transitions of word lines WLU0 and WLL0 respectively to "L" and "H" levels occur, NMOS transistor TR0 is turned on. At this time, charges of word line WLU0 of "H" level can be utilized for charging of word line WLL0, achieving high speed and low power consumption. 512 equalize circuits 5 provided corresponding to 512 sets of bit line pairs BL0, /BL0-BL511, /BL511 are controlled by one equalize signal line EQ1 and one equalize signal line EQ2. 512 precharge circuits 7 provided corresponding to 512 sets of bit line pairs BL0, /BL0-BL511, /BL511 are controlled by one precharge signal line PC. All equalize circuits 5 and all precharge circuits 7 are collectively controlled by control circuit 25. In order to achieve such collective control, SRAM operates such that all equalize circuits 5 and precharge circuits 7 are turned off when word lines are activated. In other words, equalize circuits 5 and precharge circuits 7 corresponding to non-selected columns are turned off. Accordingly, although bit line pairs corresponding to non-selected columns are floating, "L" level can be maintained because of the capacitance of the bit line.

Figure 16:
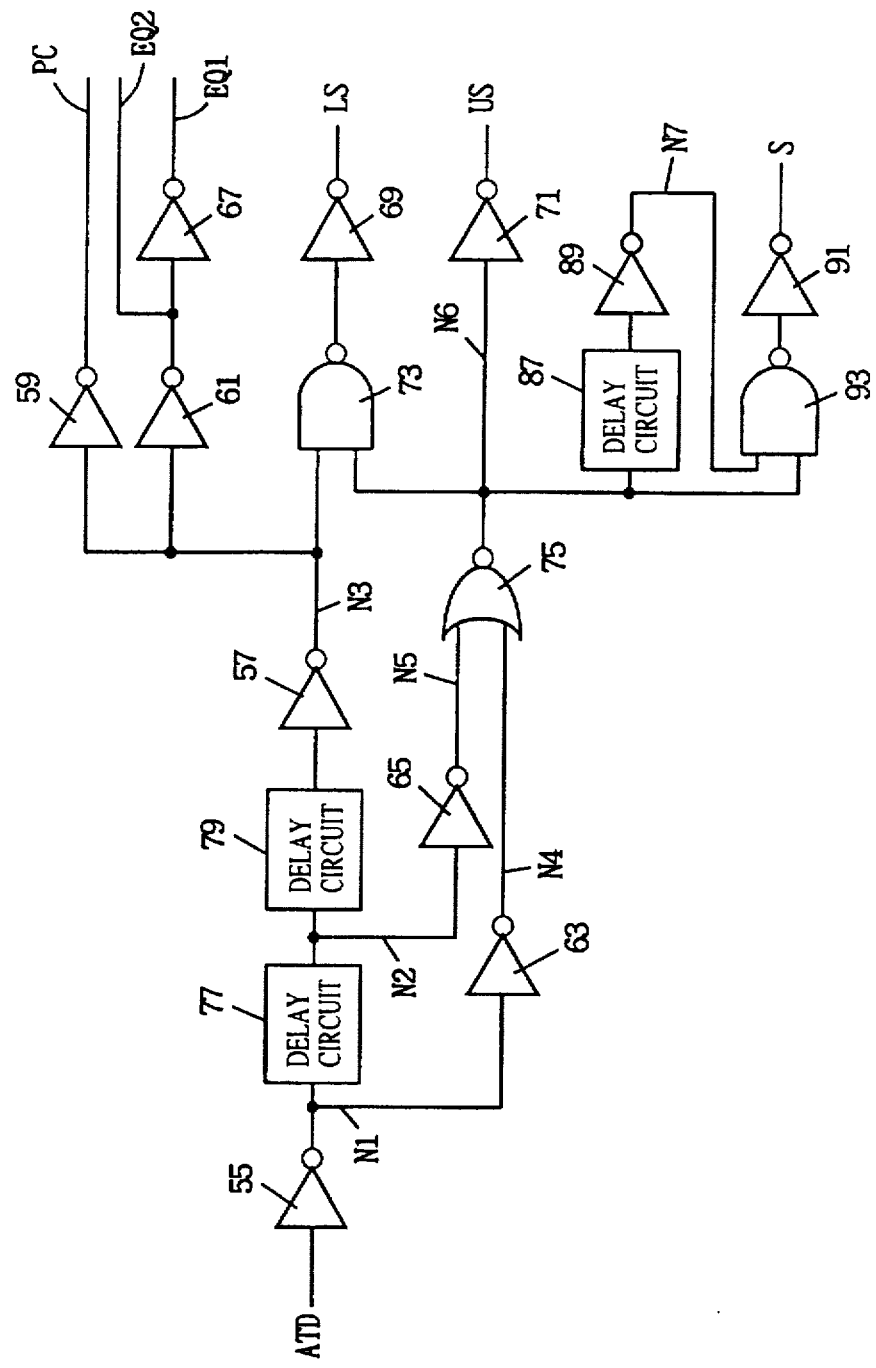
FIG. 16 is a circuit diagram specifically showing the control circuit of FIG. 15.

FIG. 16 is a circuit diagram illustrating details of control circuit 25 of FIG. 15. The parts identical to those of FIG. 8 have the same reference characters and the description thereof is not repeated. Referring to FIG. 16, the control circuit includes inverters 55-71, 89, 91, delay circuits 77, 79, 87, NAND circuits 73, 93 and NOR circuit 75. Delay circuit 87 is placed between node N6 and an input node of inverter 89. An output node of inverter 89 is connected to node N7. One input node of NAND circuit 93 is connected to node N7, and the other input node is connected to node N6. An input node of inverter 91 is connected to an output node of NAND circuit 93, and an output node thereof is connected to control signal line S. Inverter 91 outputs control signal S.

Figure 17:
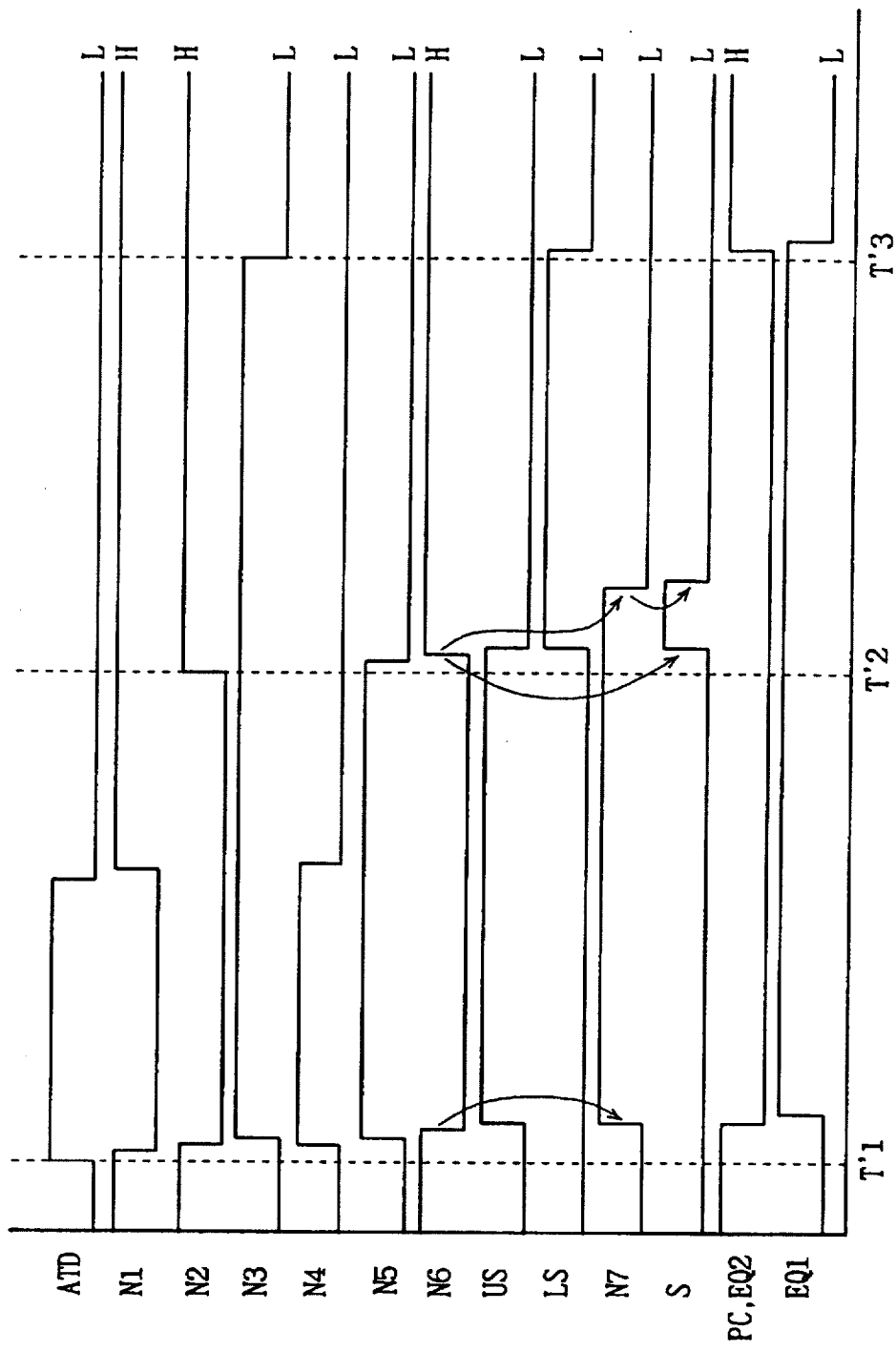
FIG. 17 is a timing chart related to the operation of the control circuit of FIG. 16.
Figure 18:
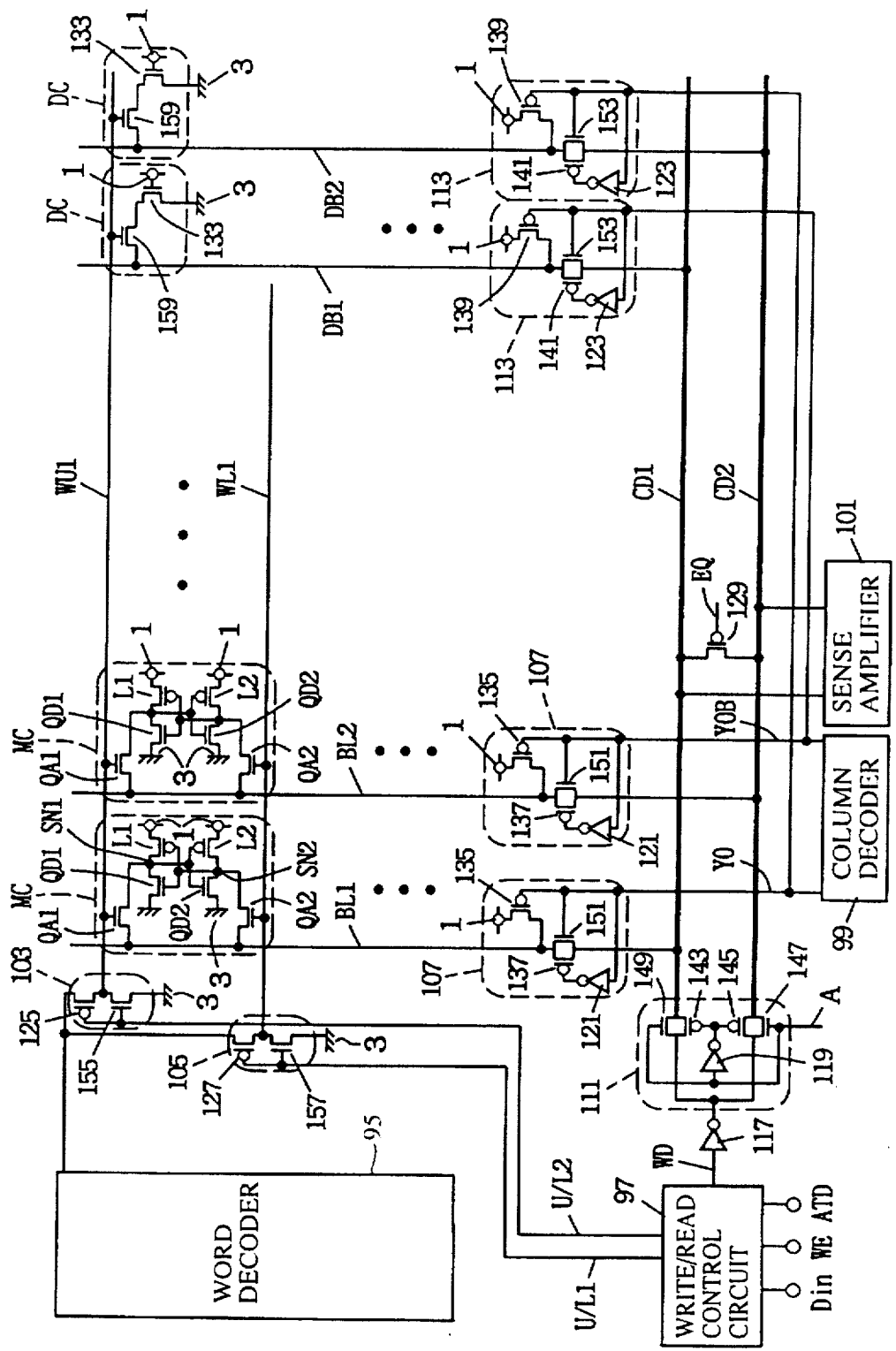
FIG. 18 is a schematic block diagram showing an entire structure of the conventional SRAM.
Figure 19:
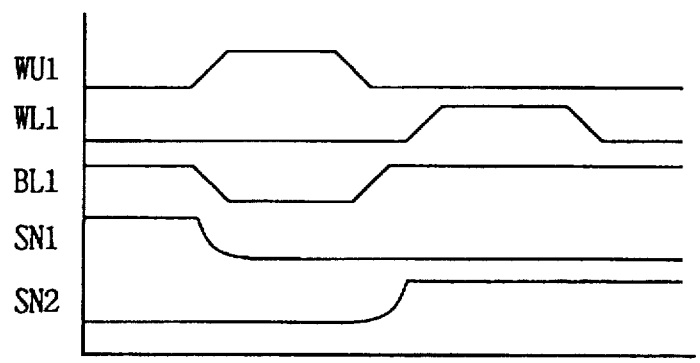
FIG. 19 is a timing chart related to the write operation ("0" write) of the conventional SRAM.
Figure 20:
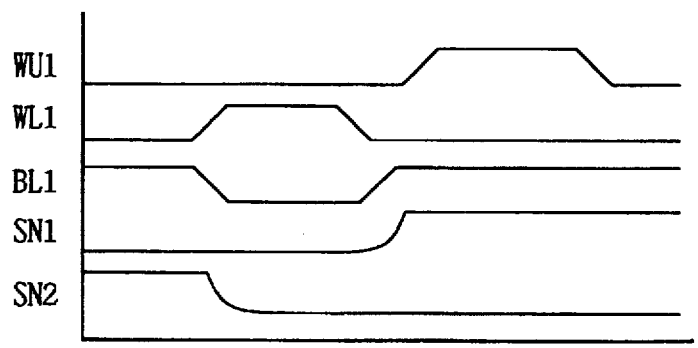
FIG. 20 is a timing chart related to the write operation ("1" write) of the conventional SRAM.

FIG. 17 is a timing chart related to an operation of the control circuit of FIG. 16. Signals and potentials which change at the same timing of signals and potentials shown in FIG. 9 bear same reference characters and the description thereof is not repeated. Referring to FIGS. 16 and 17, after time T1, transition of the potential on node N7 to "H" level occurs following the falling edge of the potential on node N6. After time T2, transition of the potential on control signal line S to "H" level occurs following the rising edge of the potential on node N6. Accordingly, NMOS transistors TR0-TR511 are all turned on. After time T2, transition of the potential on node N7 to "L" level is delayed by delay circuit 87 compared with transition of the potential on node N6 to "H" level. Following the falling edge of the potential on node N7, the potential on control signal line S attains "L" level. Accordingly, NMOS transistors TR0-TR511 are all turned off.

In the SRAM according to the second embodiment, potentials on the upper side word line and the lower side word line are set to "H" level in the same order for one cycle regardless of the type of data to be written. Therefore, a circuit for determining the type of write data is not necessary in a circuit relating to row decoding, so that the circuit relating to row decoding can be simplified. The layout area can be significantly reduced since block division and arrangement of a local decoder for every IO are not necessary.

Further, in the SRAM according to the second embodiment, a plurality of NMOS transistors TR0-TR511 are provided corresponding to a plurality of word line pairs WLU0, WLL0-WLU511, WLL511. Accordingly, in data write operation, charge on the upper side word line of "H" level can be used for charging of the lower side word line, achieving high speed and low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device, comprising:

a plurality of memory cells arranged in a matrix of rows and columns;

a plurality of first word lines arranged corresponding to said rows and each having said memory cells in the corresponding row connected thereto;

a plurality of second word lines arranged corresponding to said rows and each having said memory cells in the corresponding row connected thereto;

a plurality of bit line pairs arranged corresponding to said columns and each having said memory cells in the corresponding column connected thereto;

a plurality of first word line drive means arranged corresponding to said first word lines each for activating corresponding one of said first word lines;

a plurality of second word line drive means arranged corresponding to said second word lines each for activating corresponding one of said second word lines; and control means for controlling said first and second word line drive means corresponding to a selected row such that said first word line corresponding to the selected row is activated for a first prescribed period, and thereafter said second word line corresponding to the selected row is activated for a second prescribed period in data write operation, wherein each of said memory cells includes a first load element, a second load element, a first access transistor, a second access transistor, a first driver transistor, a second driver transistor, a first bipolar transistor, a second bipolar transistor, a first depletion type transistor, and a second depletion type transistor, said first load element is provided between a first power supply node and a first storage node, said second load element is provided between said first power supply node and a second storage node, said first access transistor is provided between the base of said first bipolar transistor and said first storage node, said second access transistor is provided between the base of said second bipolar transistor and said second storage node, said first bipolar transistor is provided between one bit line constituting said bit line pair corresponding thereto and said second power supply node, said second bipolar transistor is provided between the other bit line constituting said bit line pair corresponding thereto and said second power supply node, said first driver transistor is provided between said first storage node and said first depletion type transistor, and having its control electrode connected to said second storage node, said second driver transistor is provided between said second storage node and said second depletion type transistor, and having its control electrode connected to said first storage node, said first depletion type transistor is provided between said first driver transistor and said second power supply node, said second depletion type transistor is provided between said second driver transistor and said second power supply node, said first access transistor and said second depletion type transistor have their control electrodes connected to said first word line corresponding thereto, and said second access transistor and said first depletion type transistor have their control electrodes connected to said second word line corresponding thereto.

2. The static type semiconductor memory device according to claim 1, further comprising a plurality of data line pairs provided corresponding to respective blocks each constituted by a given number of said bit line pairs each for transmitting data to said bit line pair included in the corresponding one of said blocks.

3. The static type semiconductor memory device according to claim 2, further comprising:

data supply means provided corresponding to each of said data line pairs for supplying data to corresponding said data line pair in data write operation; and a plurality of first connecting means provided corresponding to each of said bit line pairs for connecting corresponding said bit line pair and said data line pair corresponding to the bit line pair according to a corresponding column select signal.

4. The static type semiconductor memory device according to claim 1, wherein in data writing, following data to be written, potential on one bit line constituting said bit line pair corresponding to a selected column is set to a first level, and potential on the other bit line is set to a second level from activation of said first word line corresponding to a selected row to deactivation of said second word line corresponding to the selected row.

5. The static type semiconductor memory device according to claim 2, wherein in data writing, following data to be written, potential on one bit line constituting said bit line pair corresponding to a selected column is set to a first level, and potential on the other bit line is set to a second level from activation of said first word line corresponding to a selected row to deactivation of said second word line corresponding to the selected row.

6. The static type semiconductor memory device according to claim 1, wherein in data write operation, following data to be written, potential on one bit line of said bit line pair corresponding to a selected column is set to a first level, and potential on the other bit line is set to a second level, while said first word line corresponding to a selected row is active or while said second word line corresponding to the selected row is active.

7. The static type semiconductor memory device according to claim 2, wherein in data write operation, following data to be written, potential on one bit line of said bit line pair corresponding to a selected column is set to a first level, and potential on the other bit line is set to a second level, while said first word line corresponding to a selected row is active or while said second word line corresponding to the selected row is active.

8. The static type semiconductor memory device according to claim 1, further comprising a plurality of second connecting means each provided for corresponding one of said first word lines, wherein each of said second connecting means connects corresponding said first word line and corresponding said second word line when said corresponding first word line is deactivated and said corresponding second word line is activated.

9. The static type semiconductor memory device according to claim 2, further comprising a plurality of second connecting means each provided for corresponding one of said first word lines, wherein each of said second connecting means connects corresponding said first word line and said corresponding second word line when said corresponding first word line is deactivated and said corresponding second word line is activated.

10. The static type semiconductor memory device according to claim 1, wherein said plurality of first word lines and said plurality of second word lines are formed of metal, and control electrodes of said first and second access transistors as well as control electrodes of said first and second depletion type transistors constituting each of said memory cells are formed of polysilicon.

11. The static type semiconductor memory device according to claim 2, wherein said plurality of first word lines and said plurality of second word lines are formed of metal, and control electrodes of said first and second access transistors as well as control electrodes of said first and second depletion type transistors constituting each of said memory cells are formed of polysilicon.

* * * * *